United States Patent [19]

New

[11] Patent Number: 5,528,169
[45] Date of Patent: Jun. 18, 1996

[54] METHOD AND STRUCTURE FOR PROVIDING A FLIP FLOP CIRCUIT WITH A CONFIGURABLE DATA INPUT PATH

[75] Inventor: Bernard J. New, Los Gatos, Calif.

[73] Assignee: Xilinx, Inc., San Jose, Calif.

[21] Appl. No.: 430,510

[22] Filed: Apr. 26, 1995

[51] Int. Cl.$^6$ ............................................. H03K 19/0175
[52] U.S. Cl. .................... 326/40; 326/46; 327/218
[58] Field of Search ..................... 326/39–41, 46; 327/218–219

[56] References Cited

U.S. PATENT DOCUMENTS

| | | | |
|---|---|---|---|
| 5,027,011 | 6/1991 | Steele | 326/40 |
| 5,302,866 | 4/1994 | Chiang et al. | 326/40 |
| 5,317,210 | 5/1994 | Patel | 326/40 |
| 5,410,194 | 4/1995 | Freidin et al. | 327/218 X |
| 5,430,390 | 7/1995 | Chan et al. | 326/39 X |
| 5,442,306 | 8/1995 | Woo | 326/39 |
| 5,451,887 | 9/1995 | El-Ayat et al. | 326/39 |

*Primary Examiner*—David R. Hudspeth
*Attorney, Agent, or Firm*—Eric E. Hoffman; Norman R. Klivans; Edel M. Young

[57] ABSTRACT

A method and structure for a configurable flip flop circuit. The configurable flip flop circuit includes a flip flop, a first signal line for receiving a first signal, a second signal line for receiving a second signal, a first enable line for receiving a first enable signal, a second enable line for receiving a second enable signal, a programmable logic circuit and a multiplexer circuit. The programmable logic circuit receives the first and second enable signals from the first and second enable lines. In response, the programmable logic circuit generates multiplexer control signals which are provided to the multiplexer circuit. The multiplexer circuit selectably couples the first signal line, the second signal line, and the output terminal of the flip flop to the flip flop input terminal in response to the multiplexer control signals. The programmable logic circuit can be programmed to provide different multiplexer control signals in response to the same first and second enable signals, thereby advantageously allowing the priority of the first and second enable signals to be selected.

19 Claims, 8 Drawing Sheets

METHOD AND STRUCTURE FOR PROVIDING A FLIP FLOP CIRCUIT WITH A CONFIGURABLE DATA INPUT PATH

BACKGROUND OF THE INVENTION

1. Field of Invention

The present invention relates to a configurable flip flop circuit, and in particular, to a configurable flip flop circuit for use in a field programmable gate array (FPGA).

2. Description of Related Art

Figure 1:
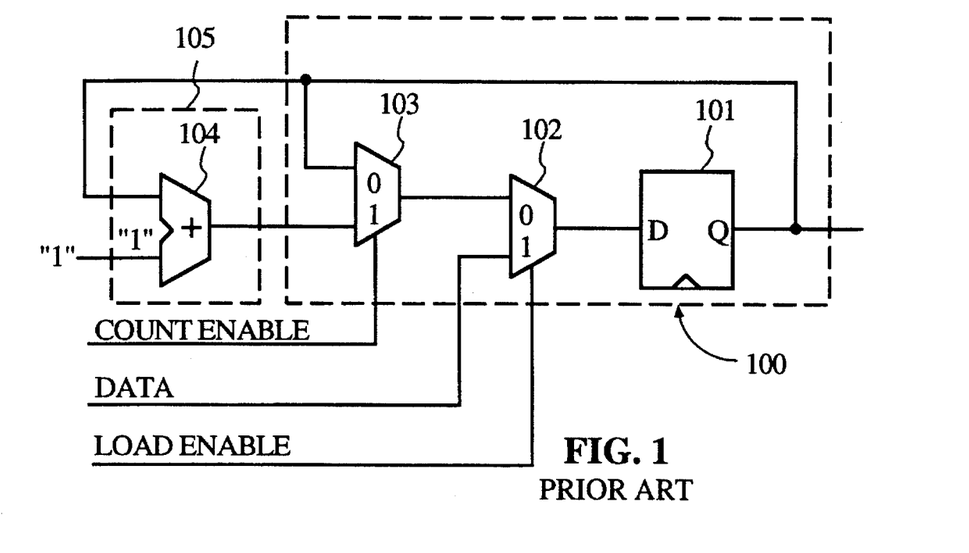
FIGS. 1 and 2 are schematic diagrams of prior art flip flop circuits.

FIG. 1 is a schematic diagram of a prior art flip flop circuit 100 used in a programmable device such as an FPGA. Flip flop circuit 100 includes D flip flop 101, and two-tone multiplexers 102 and 103. Flip flop circuit 100 is coupled to programmable logic block 105 as described below. The Q output terminal of flip flop 101 is connected to the "0" input terminal of multiplexer 103. The Q output terminal of flip flop 101 is also connected to an input terminal of programmable logic block 105 through programmable interconnect circuitry (not shown). Using a digital counter circuit as an example, programmable logic block 105 implements an adder circuit 104 which increments the signal at the Q output terminal of flip flop 101 by one. The output terminal of adder circuit 104 is connected to the "1" input terminal of multiplexer 103. The signal at the output terminal of multiplexer 103 is either equal to the contents of flip flop 101 or the contents of flip flop 101 incremented by one, depending upon the status of the count enable signal provided to the control terminal of multiplexer 103. When the count enable signal is in a logic low state (i.e., "0"), the signal at the "0" input terminal of multiplexer 103 is transmitted through multiplexer 103. Conversely, a logic high count enable signal causes the signal at the "1" input terminal of multiplexer 103 to be transmitted through multiplexer 103. This convention is maintained for the multiplexers described below.

The output terminal of multiplexer 103 is connected to the "0" input terminal of multiplexer 102. The "1" input terminal of multiplexer 102 is connected to a line which receives a data signal. The signal at the output terminal of multiplexer 102 is either equal to the output signal from multiplexer 103 or the data signal, depending upon the status of the load enable signal provided to the control terminal of multiplexer 102. The output terminal of multiplexer 102 is connected to the D input terminal of flip flop 101. Table 1 describes the operation of flip flop circuit 100.

TABLE 1

| Count Enable | Load Enable | Effect on Contents of Flip Flop 101 |
|---|---|---|
| 0 | 0 | Unchanged (No Operation) |
| 0 | 1 | Load Data Signal |
| 1 | 0 | Increment by One |
| 1 | 1 | Load Data Signal |

Thus, in flip flop circuit 100, the operation of loading the data signal takes precedence over the operations of incrementing by one and performing no operation. That is, regardless of the status of the count enable signal, a load operation will be performed when the load enable signal is asserted. This method of operating is desired in certain digital counter circuits.

Figure 2:
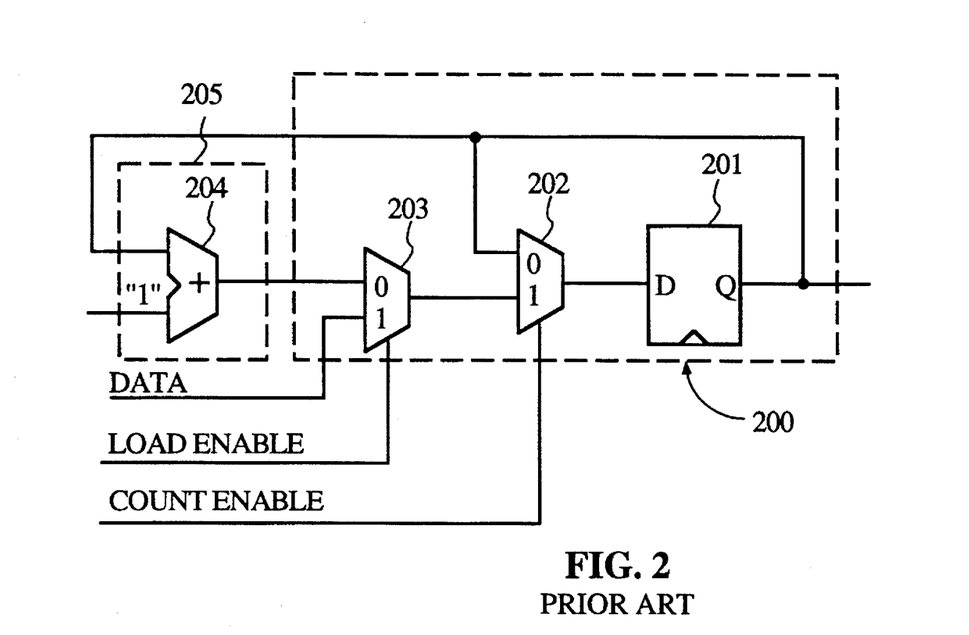

FIG. 2 is a schematic diagram of another prior art flip flop circuit 200. Flip flop circuit 200 includes D flip flop 201, and two-to-one multiplexers 202 and 203. Programmable logic block 205 is coupled to flip flop circuit as described below. The Q output terminal of flip flop 201 is connected to an input terminal of programmable logic block 205 using programmable interconnect circuitry (not shown). Programmable logic block 205 implements an adder circuit 204 which increments the signal at the Q output terminal of flip flop 201 by one. The output terminal of adder 204 is connected to the "0" input terminal of multiplexer 203. The "1" input terminal of multiplexer 203 is connected to a line which receives a data signal. Multiplexer 203 is controlled by a load enable signal.

The output terminal of multiplexer 203 is connected to the "1" input terminal of multiplexer 202. The "0" input terminal of multiplexer 202 is connected to the Q output terminal of flip flop 201. Multiplexer 202 is controlled by a count enable signal. The output terminal of multiplexer 202 is connected to the D input terminal of flip flop 201. Table 2 describes the operation of flip flop circuit 200.

TABLE 2

| Count Enable | Load Enable | Effect on Contents of Flip Flop 201 |
|---|---|---|
| 0 | 0 | Unchanged (No Operation) |
| 0 | 1 | Unchanged (No Operation) |
| 1 | 0 | Increment by One |
| 1 | 1 | Load Data Signal |

Thus, in flip flop circuit 200, the "no operation" instruction takes precedence over the operation of loading the data signal and the operation of incrementing the contents of flip flop 201 by one. That is, if the count enable signal is de-asserted low, the "no operation" instruction is implemented, regardless of the state of the load enable signal. This method of operating is desirable in certain digital counter circuits.

Prior art FPGAs are designed to utilize flip flop circuitry in accordance with either flip flop circuit 100 or flip flop circuit 200. The selected flip flop circuit is "hard-wired" during the fabrication of the FPGA. Once the flip flop circuitry is selected and fabricated, this circuitry cannot be easily modified to provide the nonselected flip flop circuitry. Therefore, if flip flop circuit 100 is fabricated on an FPGA, this flip flop circuit cannot later be modified to provide flip flop circuit 200. Because the circuit designer who programs the FPGA may require the use of flip flop circuit 100 and/or flip flop circuit 200, it would be desirable to have a flip flop circuit capable of being configured like flip flop circuit 100 or flip flop circuit 200 at the discretion of the designer, rather than during fabrication.

SUMMARY OF THE INVENTION

Accordingly, the present invention provides a method and structure for providing a configurable flip flop circuit. The configurable flip flop circuit includes a flip flop, a first signal line for receiving a first signal, a second signal line for receiving a second signal, a first enable line for receiving a first enable signal, a second enable line for receiving a second enable signal, a programmable logic circuit dedicated to flip flop control and a multiplexer circuit.

The programmable logic circuit receives the first and second enable signals from the first and second enable lines. In response, the programmable logic circuit generates multiplexer control signals which are provided to the multiplexer circuit. The multiplexer circuit selectably couples the first signal line, the second signal line, and the output terminal of the flip flop to the flip flop input terminal in response to the multiplexer control signals.

The programmable logic circuit can be programmed to provide different multiplexer control signals in response to the same first and second enable signals, thereby advantageously allowing the priority of the first and second enable signals to be selected.

In one embodiment, the first signal is a data signal, the second signal is an output signal from a programmable logic block, and the first and second enable signals are count and load enable signals, respectively. In this embodiment, the programmable logic circuit can be programmed such that the flip flop circuit operates in accordance with Table 1 or Table 2 as set forth above. Consequently, the "configuration" of the flip flop circuit can be modified by re-programming the programmable logic circuit.

The invention includes a method of operating a flip flop circuit which includes the steps of: (1) transmitting a first signal to a first input terminal of a multiplexer circuit, (2) transmitting a second signal to a second input terminal of the multiplexer circuit, (3) transmitting an output signal from the flip flop to a third input terminal of the multiplexer circuit, (4) transmitting first and second enable signals to a programmable logic circuit, (5) generating multiplexer control signals within the programmable logic circuit in response to the first and second enable signals, (6) transmitting the multiplexer control signals to control terminals of the multiplexer circuit, and (7) selectably coupling the first, second or third input terminal to an input terminal of the flip flop in response to the multiplexer control signals.

The present invention will be more fully understood in light of the following detailed description taken together with the drawings.

DETAILED DESCRIPTION OF THE INVENTION

Figure 3:
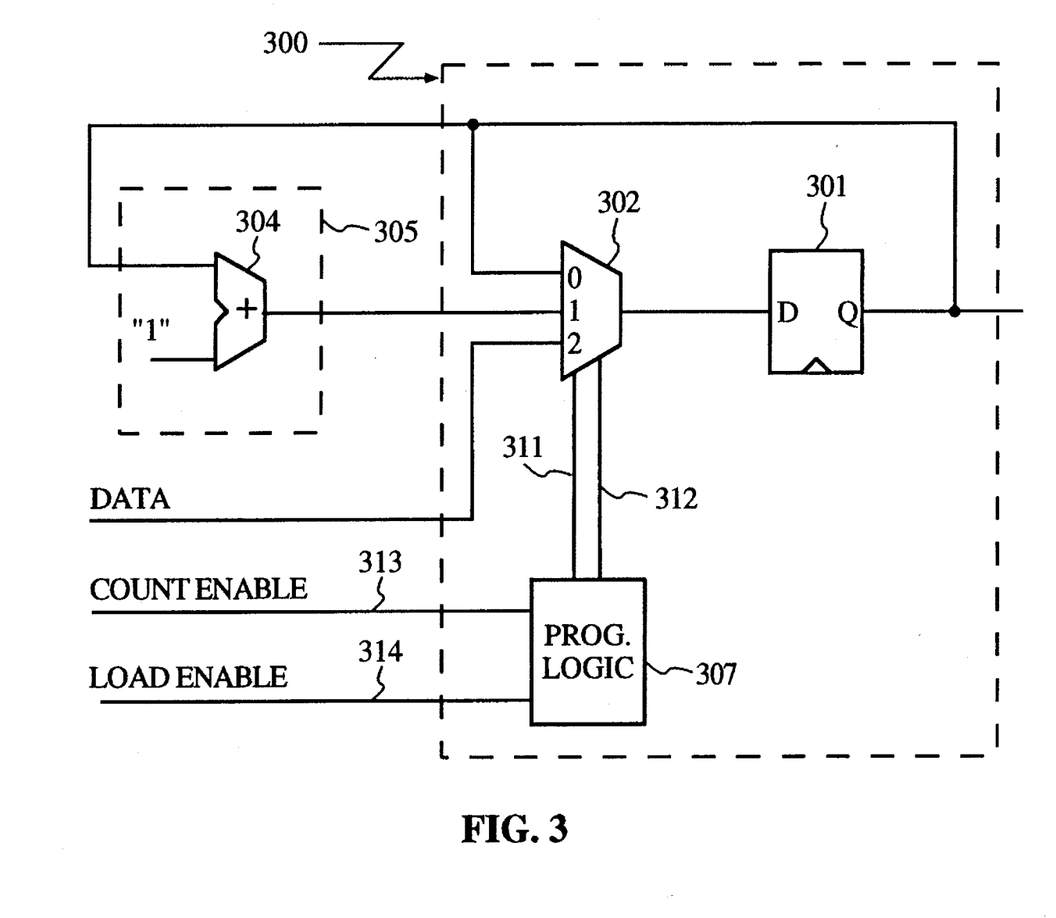
FIG. 3 is a schematic diagram of a flip flop circuit in accordance with one embodiment of the present invention.

FIG. 3 is a schematic diagram of a flip flop circuit 300 in accordance with the invention. Flip flop circuit 300 includes flip flop 301, three-to-one multiplexer 302, and programmable logic circuit 307. Flip flop circuit 300 is coupled to programmable logic block 305 as described below. In the embodiment illustrated, flip flop 301 is a conventional D flip flop, however, other types of flip flops can be used. The Q output terminal of flip flop 301 is connected to the "0" input terminal of multiplexer 302. The Q output terminal of flip flop 301 is also connected to an input terminal of programmable logic block 305 using programmable interconnect circuitry (not shown). Programmable logic block 305 is illustrated as an adder circuit 304. The other input terminal of adder circuit 304 is a logical "1" signal. Thus, programmable logic block 305 increments by one the data value provided at the Q output terminal of flip flop 301.

While programmable logic block 305 is illustrated as a two-input terminal adder circuit, it is understood that programmable logic block 305 can receive other input signals and perform other logical functions. For example, programmable logic block 305 can include logic gates which can be configured to perform any number of functions. Furthermore, programmable logic block 305 can receive inputs from other flip flop circuits or programmable logic blocks.

The output terminal of programmable logic block 305 is provided to the "1" input terminal of multiplexer 302. A data signal is provided to the "2" input terminal of multiplexer 302. The data signal can come from various sources, including, but not limited to, the Q output terminal of another flip flop circuit (not shown).

Multiplexer 302 is controlled by multiplexer control signals received on leads 311 and 312. These control signals are generated by programmable logic circuit 307 in response to the count enable and load enable signals provided on lines 313 and 314, respectively. Table 3 describes the manner in which multiplexer 302 passes the signals applied to its input terminals.

TABLE 3

| Signal on Lead 311 | Signal on Lead 312 | MUX Input Terminal Coupled to MUX Output Terminal |
|---|---|---|
| 0 | 0 | 0 |
| 0 | 1 | 1 |
| 1 | 0 | 2 |
| 1 | 1 | X |

Figure 4:
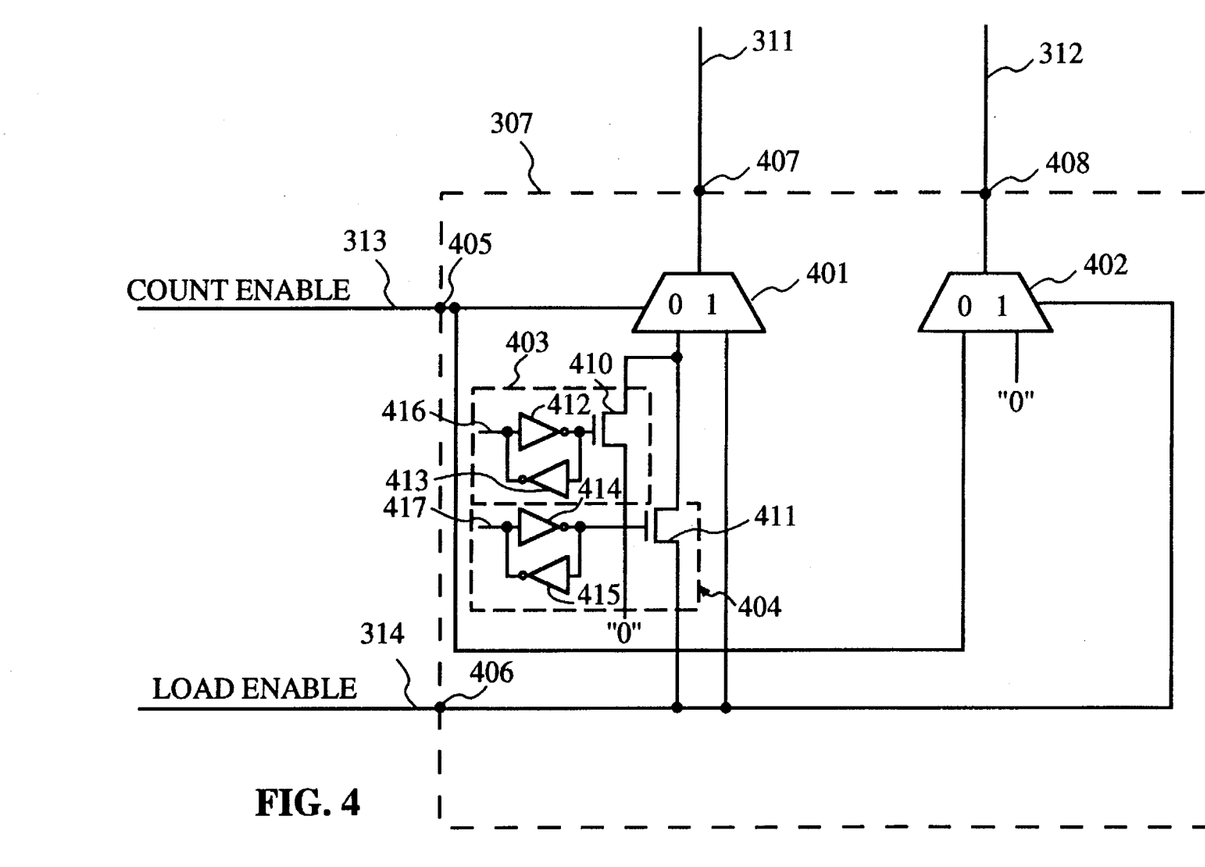
FIGS. 4, 5, 6a and 6b are schematic diagrams of programmable logic circuits as used in the circuit of FIG. 3.

FIG. 4 is a schematic diagram of one embodiment of programmable logic circuit 307, which includes two-to-one multiplexers 401 and 402, programmable switches 403 and 404, input terminals 405 and 406 and output terminals 407 and 408. Leads 313 and 314 are connected to input terminals 405 and 406, respectively, and leads 311 and 312 are connected to output terminals 407 and 408, respectively.

The count enable signal is transmitted to the control terminal of multiplexer 401 and the "0" input terminal of multiplexer 402. The load enable signal is transmitted to switch 404, the "1" input terminal of multiplexer 401, and the control terminal of multiplexer 402. Logic "0" signals are transmitted to switch 403 and the "1" input terminal of multiplexer 402. In the embodiment illustrated, switch 403 includes pass transistor 410 and a latch formed by inverters 412 and 413. Switch 403 is programmed by providing a signal on lead 416. This signal is stored by the latch formed by inverters 412 and 413. The stored signal is applied to the gate of pass transistor 410, thereby turning pass transistor 410 on or off. Switch 404, which includes pass transistor 411, inverters 414 and 415 and lead 417, operates in a similar manner. Only one of switches 403 and 404 is closed during normal operation of programmable logic circuit 307. Programmable switches 403 and 404 can be realized in other manners. For example, the gate of pass transistor 411 can be controlled by the output of inverter 413. Also, conventional complementary pass transistors (not shown) can be used in each programmable switch 403 and 404. Switches 403 and 404 are programmed by the user of the FPGA to select the configuration of flip flop circuit 300.

Table 4 describes the operation of flip flop circuit 300 (FIG. 3) when switch 403 is open and switch 404 is closed.

TABLE 4

| Count Enable | Load Enable | Signal on Lead 311 | Signal on Lead 312 | Effect on Contents of Flip Flop 301 |
|---|---|---|---|---|
| 0 | 0 | 0 | 0 | Unchanged (No Operation) |
| 0 | 1 | 1 | 0 | Load Data Signal |
| 1 | 0 | 0 | 1 | Increment by One |
| 1 | 1 | 1 | 0 | Load Data Signal |

Therefore, when switch 403 is open and switch 404 is closed, flip flop circuit 300 operates in a manner similar to flip flop circuit 100 (FIG. 1; Table 1).

Table 5 illustrates the operation of flip flop circuit 300 (FIG. 3) when switch 403 is closed and switch 404 is open.

TABLE 5

| Count Enable | Load Enable | Signal on Lead 311 | Signal on Lead 312 | Effect on Contents of Flip Flop 301 |
|---|---|---|---|---|
| 0 | 0 | 0 | 0 | Unchanged (No Operation) |
| 0 | 1 | 0 | 0 | Unchanged (No Operation) |
| 1 | 0 | 0 | 1 | Increment by one |
| 1 | 1 | 1 | 0 | Load Data Signal |

Therefore, when switch 403 is closed and switch 404 is open, flip flop circuit 300 operates in a manner similar to flip flop circuit 200 (FIG. 2; Table 2).

Figure 5:
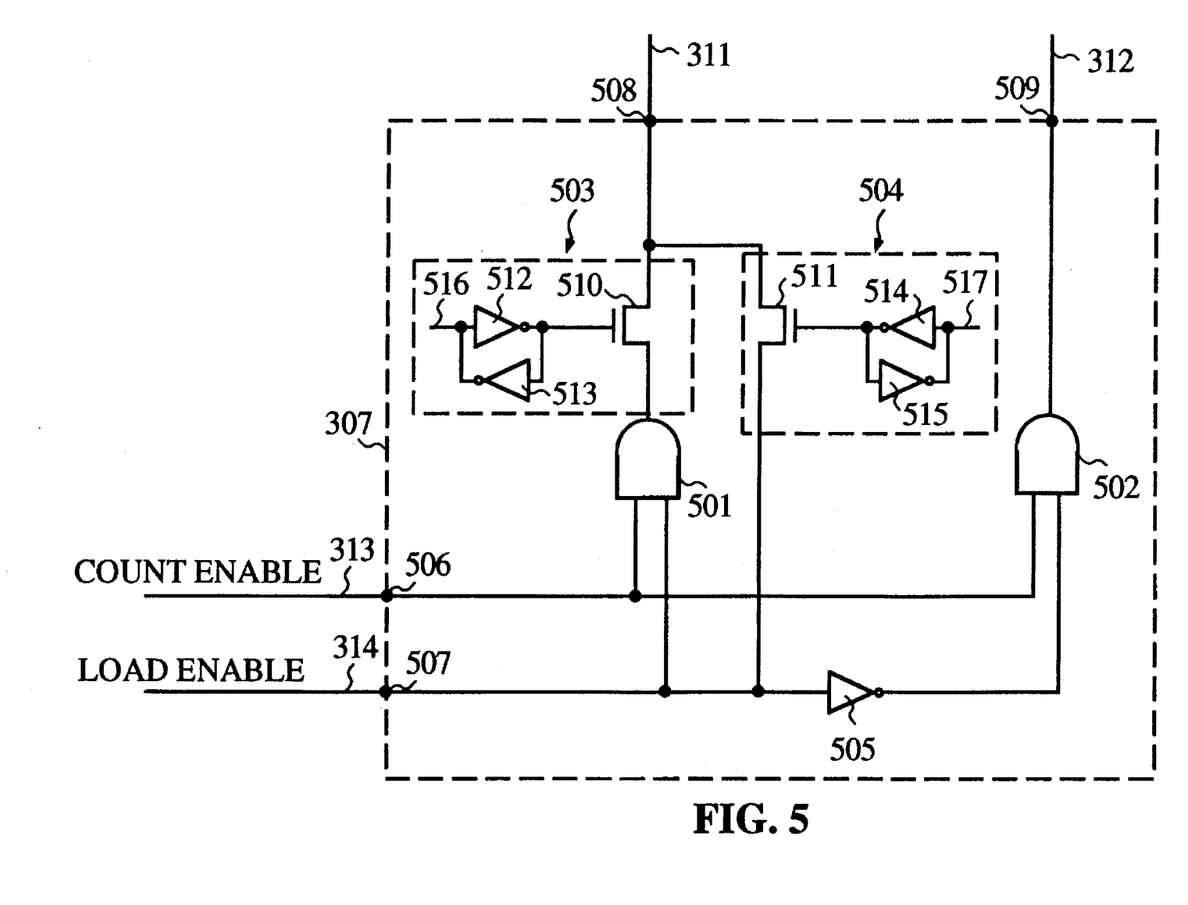

Programmable logic circuit 307 can be realized in various ways. FIG. 5 is a schematic diagram of an alternate embodiment of programmable logic circuit 307 which includes AND gates 501 and 502, programmable switches 503 and 504, inverter 505, input terminals 506 and 507 and output terminals 508 and 509. Input terminals 506 and 507 are connected to leads 313 and 314, respectively, and output terminals 508 and 509 are connected to leads 311 and 312, respectively.

The count enable signal is provided to input terminals of AND gates 501 and 502. The load enable signal is provided to an input terminal of AND gate 501, to switch 504, and to inverter 505. The output terminal of inverter 505 is connected to an input terminal of AND gate 502.

Switches 503 and 504, which include pass transistors 510 and 511, inverters 512–515 and input leads 516 and 517, are programmed by the user of the FPGA as previously described in connection with switches 403 and 404 (FIG. 4). Switch 503, when closed, connects the output terminal of AND gate 501 to output terminal 508. Switch 504, when closed, connects line 314 to output terminal 508. The output terminal of AND gate 502 is connected to output terminal 509.

When switch 503 is open and switch 504 is closed, flip flop circuit 300 (FIG. 3) operates in accordance with Table 4 (i.e., in a manner similar to flip flop circuit 100 (FIG. 1)). When switch 503 is closed and switch 504 is open, flip flop circuit 300 (FIG. 3) operates in accordance with Table 5 (i.e., in a manner similar to flip flop circuit 200 (FIG. 2)). In other embodiments, the input signals applied to multiplexers 601 and 602 can be changed to allow the implementation of other functions.

Figure 6A:
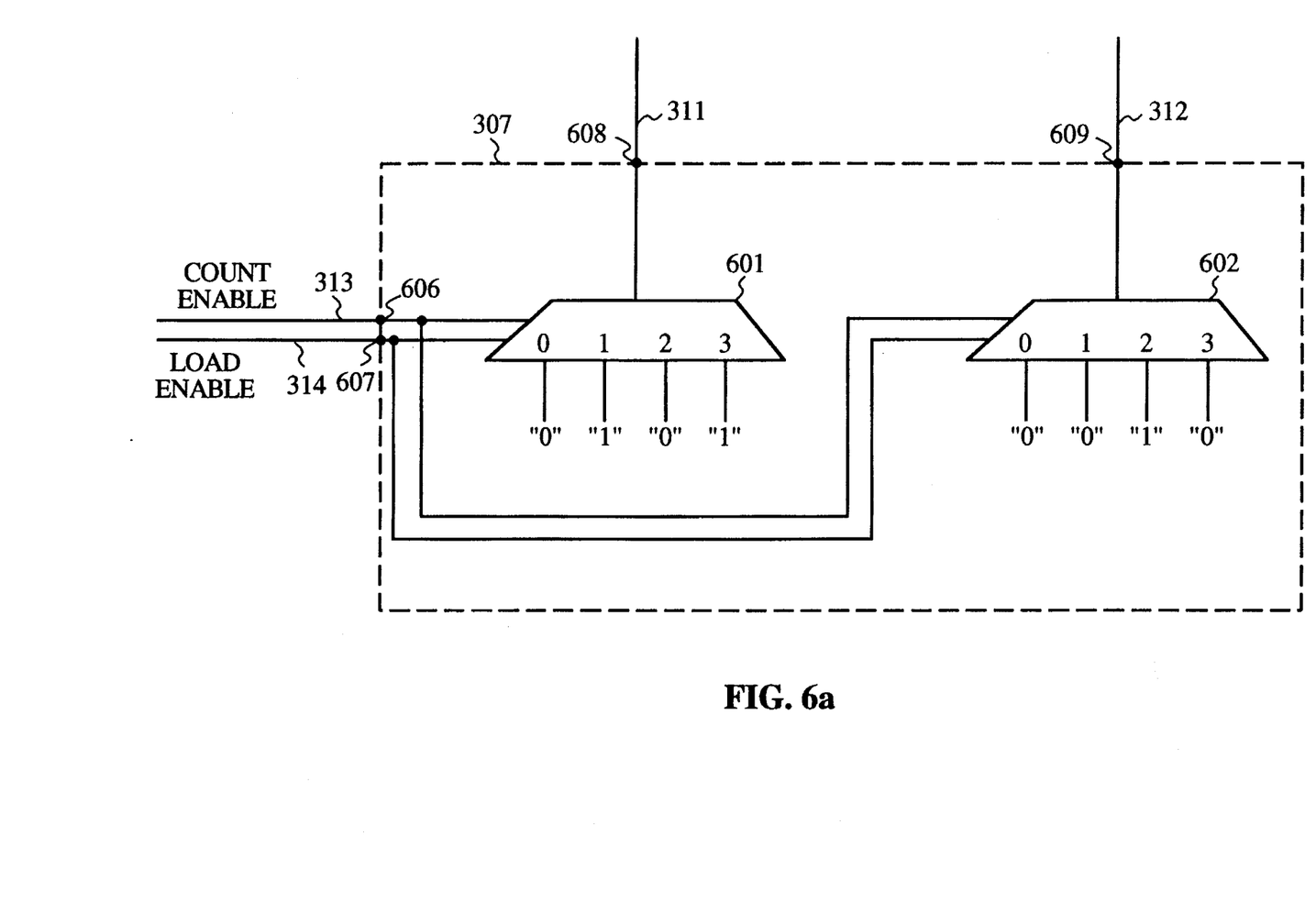
Figure 6B:
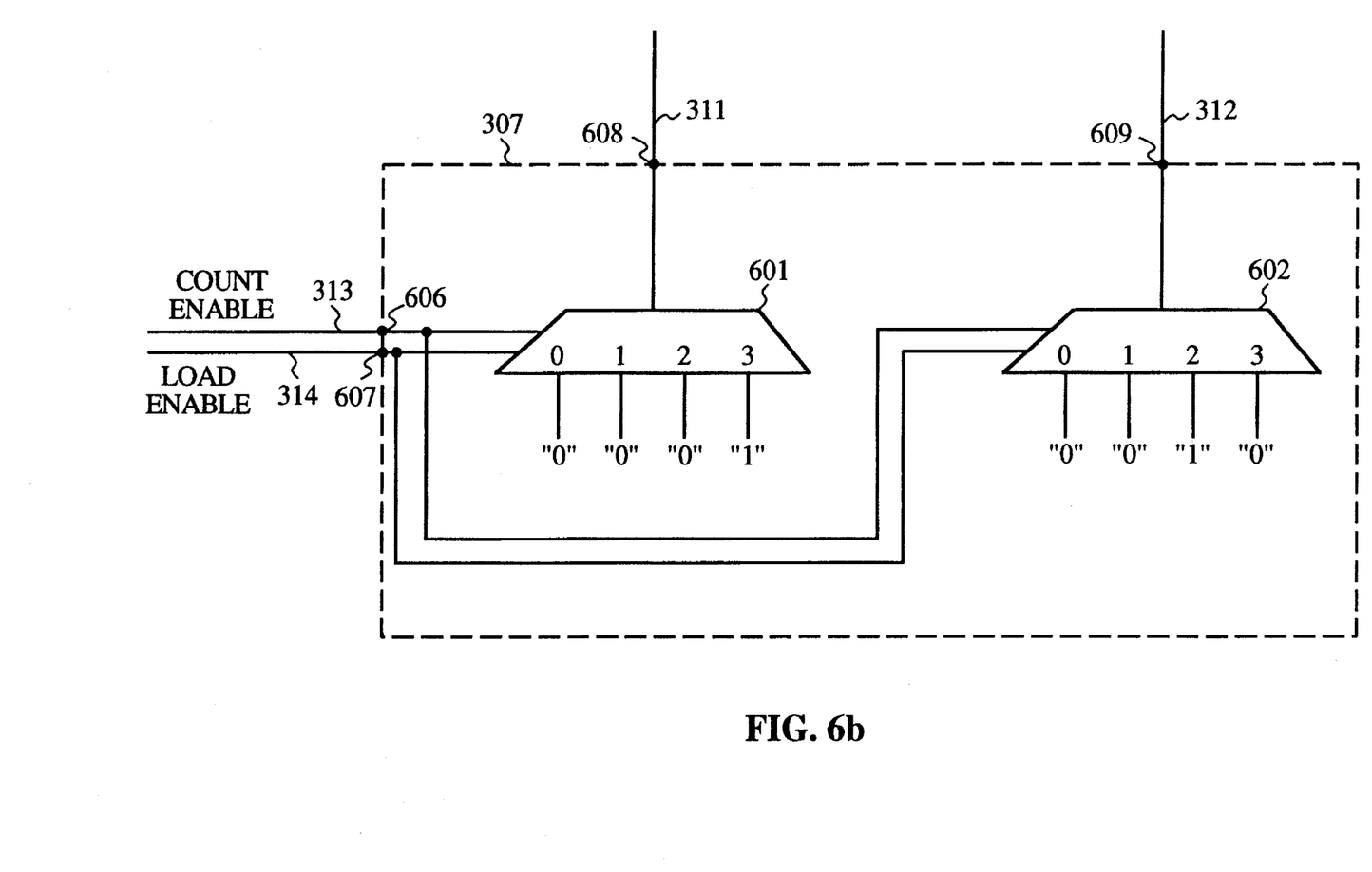

FIGS. 6a and 6b are schematic diagrams which illustrate another embodiment of programmable logic circuit 307 which includes four-to-one multiplexers 601 and 602. Leads 313 and 314 are connected to input terminals 606 and 607, respectively, and leads 311 and 312 are connected to output terminals 608 and 609, respectively. The count enable and load enable signals are transmitted on leads 313 and 314, respectively, to the control terminals of multiplexers 601 and 602. In response to the count enable and load enable signals, multiplexers 601 and 602 pass one of the signals applied to their input terminals. Table 6 describes the manner in which multiplexers 601 and 601 pass the signals applied to their input terminals.

TABLE 6

| Count Enable | Load Enable | MUX Input Terminal Coupled to MUX Output Terminal |
|---|---|---|
| 0 | 0 | 0 |
| 0 | 1 | 1 |
| 1 | 0 | 2 |
| 1 | 1 | 3 |

The input signals provided to the input terminals of multiplexers 601 and 602 can be programmed by the FPGA user in accordance with conventional techniques, such as writing the desired input signals to latches coupled to the input terminals. In this manner, multiplexers 601 and 602 operate as programmable look up tables.

When the input signals applied to multiplexers 601 and 602 are selected as illustrated in FIG. 6a (i.e., logic low signals applied to the "0" and "2" input terminals of multiplexer 601, logic high signals applied to the "1" and "3" input terminals of multiplexer 601, logic low signals applied to the "0", "1", and "3" input terminals of multiplexer 602, and a logic high signal applied to the "2" input terminal of multiplexer 602), flip flop circuit 300 (FIG. 3) operates in accordance with Table 4 (i.e., in a manner similar to flip flop circuit 100 (FIG. 1)).

When the input signals applied to multiplexers 601 and 602 are selected as illustrated in FIG. 6b (i.e., logic low signals applied to the "0", "1" and "2" input terminals of multiplexer 601, a logic high signal applied to the "3" input terminal of multiplexer 601, logic low signals applied to the "0", "1", and "3" input terminals of multiplexer 602, and a logic high signal applied to the "2" input terminal of multiplexer 602), flip flop circuit 300 (FIG. 3) operates in accordance with Table 5 (i.e., in a manner similar to flip flop circuit 200 (FIG. 2)).

Although programmable logic circuit 307 has been described in connection with particular circuits, other circuits are possible. Programmable logic circuit 307 is intended to include any circuit which can be programmed in at least two modes. In the first mode, programmable logic circuit 307 receives a plurality of input control signals and in response generates a first set of output control signals which controls the input signals provided to flip flop 301. In the second mode, programmable logic circuit 307 receives the same plurality of input control signals and in response generates a second set of output control signals, different from the first set of output control signals, which controls the input signals provided to flip flop 301 in a manner different than the first set of output control signals.

Figure 7:
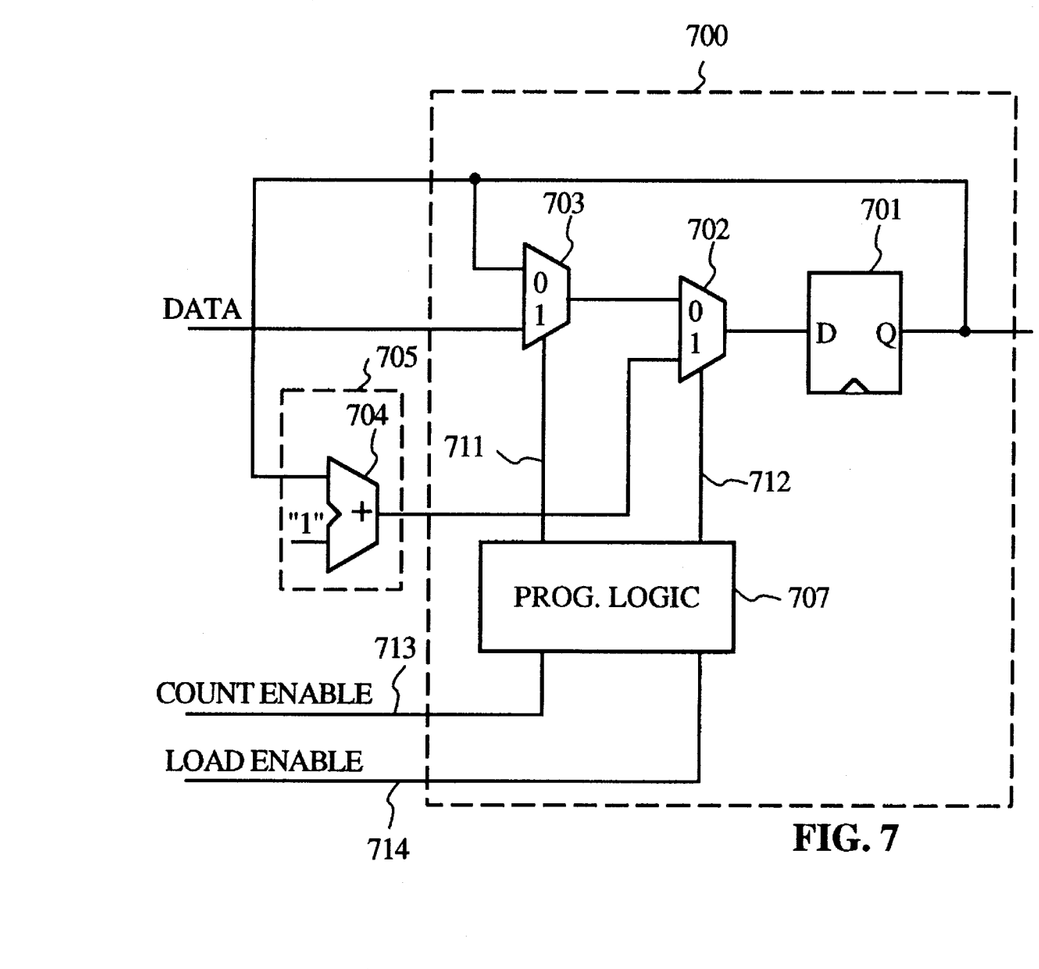
FIGS. 7 and 8 are schematic diagrams of a flip flop circuit in accordance with alternate embodiments of the present invention.

FIG. 7 is a schematic diagram of another flip flop circuit 700 in accordance with the invention. Flip flop circuit 700 includes D flip flop 701, two-to-one multiplexers 702 and 703, and programmable logic circuit 707. Programmable logic block 705 (which includes adder circuit 704) is coupled to flip flop circuit 700 as described below. The Q output terminal of flip flop 701 is connected to the "0" input terminal of flip flop 703. The "1" input terminal of multiplexer 703 receives a data signal. The output of multiplexer 703 is connected to the "0" input terminal of multiplexer 702. The "1" input terminal of multiplexer 702 is connected to the output terminal of programmable logic block 705. One input terminal of programmable logic block 705 (i.e., adder circuit 704) is connected to the Q output terminal of flip flop 701 using programmable interconnect circuitry (not shown). The other input terminal of programmable logic block 705 receives a logic "1" signal. The output terminal of multiplexer 702 is connected to the D input terminal of flip flop 701.

Multiplexer control signals are transmitted from programmable logic circuit 707 to the control terminals of multiplexers 702 and 703 on leads 711 and 712, respectively. These control signals are generated by programmable logic circuit 707 in response to the count enable signal on line 713 and the load enable signal on line 714.

In one embodiment, the programmable logic circuit 307 of FIG. 4 is used in programmable logic circuit 707 of FIG. 7. In such an embodiment, leads 713 and 714 (FIG. 7) are connected to input terminals 405 and 406, respectively (FIG. 4). Additionally, leads 711 and 712 (FIG. 7) are connected to output terminals 407 and 407, respectively (FIG. 4). Given these connections, flip flop circuit 700 operates in accordance with Tables 4 and 5.

In another embodiment, the programmable logic circuit 307 of FIG. 5 is used in programmable logic circuit 707 of FIG. 7. In such an embodiment, leads 713 and 714 (FIG. 7) are connected to input terminals 506 and 507, respectively (FIG. 5). Additionally, leads 711 and 712 (FIG. 7) are connected to output terminals 508 and 509, respectively (FIG. 5). Given these connections, flip flop circuit 700 operates in accordance with Tables 4 and 5.

In yet another embodiment, the programmable logic circuit 307 of FIGS. 6a and 6b is used in programmable logic circuit 707 of FIG. 7. In such an embodiment, leads 713 and 714 (FIG. 7) are connected to input terminals 606 and 607, respectively (FIGS. 6a and 6b). Additionally, leads 711 and 712 (FIG. 7) are connected to output terminals 608 and 609, respectively (FIGS. 6a and 6b). Given these connections, flip flop circuit 700 operates in accordance with Tables 4 and 5.

Programmable logic circuits 307 (FIG. 3) and 707 (FIG. 7) can include circuitry to provide any operating instruction set in response to the count enable and load enable signals. In particular variations of the invention, programmable logic circuit 307 (or 707) is selected such that only two of the three operations (i.e., load data signal, increment by one, and no operation) are performed.

Figure 8:
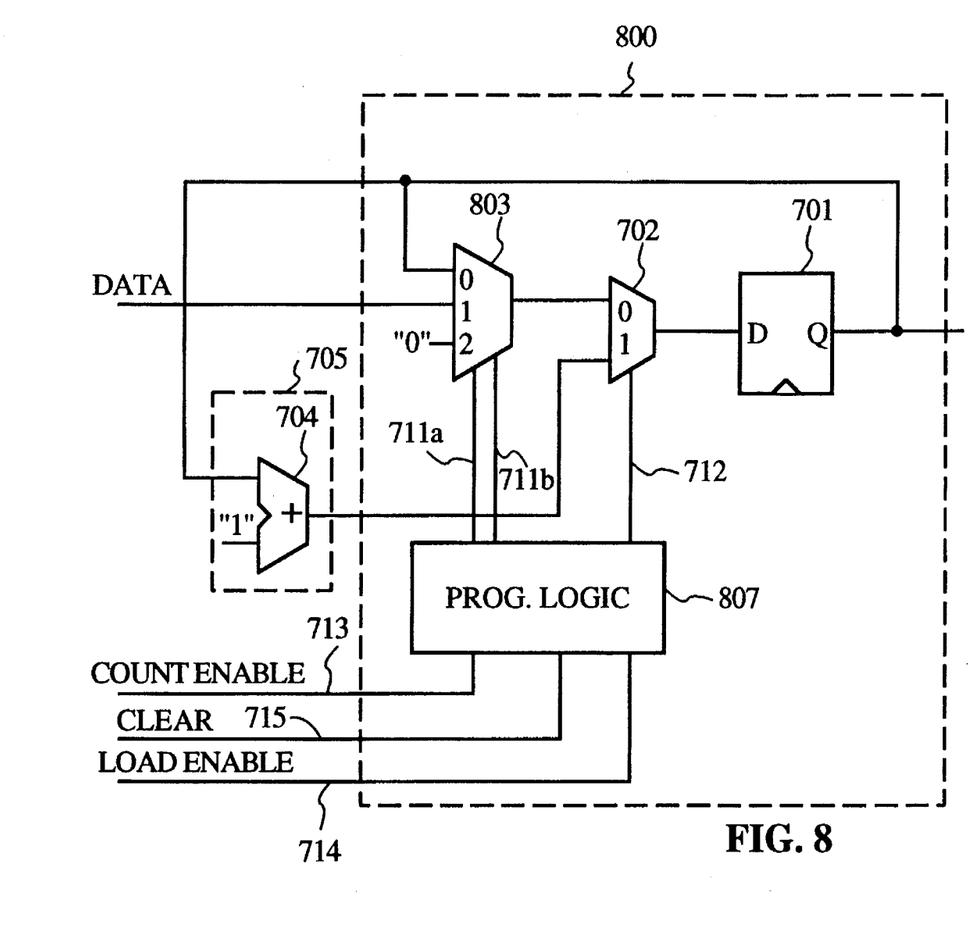

In alternative embodiments, input signals other than count enable and load enable can be used to operate a flip flop circuit in accordance with the present invention. Moreover, instructions other than "no operation", "load data" and "increment by one" can be performed. To illustrate one possible variation, FIG. 8 shows flip flop circuit 800, which is a modification to flip flop circuit 700 of FIG. 7. Similar elements in FIGS. 7 and 8 are labeled with similar numbers. Programmable logic circuit 807 of flip flop circuit 800 receives an additional input signal (i.e., the Clear signal) on lead 715. Programmable logic circuit 807 generates multiplexer control signals in response to the Count Enable, Load Enable and Clear signals, and provides these signals on leads 711a, 711b and 712. The control signals on leads 711a and 711b control three-to-one multiplexer 803. A logic low signal is applied to the "2" input terminal of multiplexer 803. In one embodiment, programmable logic circuit 807 operates in accordance with Table 7.

TABLE 7

| Count Enable | Load Enable | Clear | Signal on Lead 711a | Signal on Lead 711b | Signal on Lead 712 | Effect on Flip Flop 301 |
| --- | --- | --- | --- | --- | --- | --- |
| 0 | 0 | 0 | 0 | 0 | 0 | No Operation |
| 0 | 0 | 1 | 1 | 0 | 0 | Reset |
| 0 | 1 | 0 | 0 | 1 | 0 | Load Data |
| 0 | 1 | 1 | 0 | 1 | 0 | Load Data |
| 1 | 0 | 0 | 0 | 0 | 1 | Increment |
| 1 | 0 | 1 | 0 | 0 | 1 | Increment |
| 1 | 1 | 0 | 0 | 1 | 0 | Load Data |
| 1 | 1 | 1 | 0 | 1 | 0 | Load Data |

As set forth in Table 7, flip flop circuit 800 performs an additional instruction, in which the value stored in flip flop 701 is reset to a logic low value. This reset instruction is performed by transmitting the logic low input signal at the "2" input terminal of multiplexer 803 to the input terminal of flip flop 701.

Although the invention has been described in connection with several embodiments, it is understood that this invention is not limited to the embodiments disclosed, but is capable of various modifications which would be apparent to one of ordinary skill in the art. Thus, the invention is limited only by the following claims.

I claim:

1. A configurable flip flop circuit comprising:

a flip flop having an input terminal and an output terminal;

a first signal line for receiving a first signal;

a second signal line for receiving a second signal;

a first enable line for receiving a first enable signal;

a second enable line for receiving a second enable signal;

a multiplexer circuit having first, second and third input terminals, an output terminal, and first and second control terminals, wherein the first input terminal is coupled to the first signal line, the second input terminal is coupled to the second signal line, the third input terminal is coupled to the flip flop output terminal, and the multiplexer circuit output terminal is coupled to the flip flop input terminal; and a programmable logic circuit having a first input terminal coupled to the first enable line, a second input terminal coupled to the second enable line, a first output terminal coupled to the first control terminal and a second output terminal coupled to the second control terminal.

2. The flip flop circuit of claim 1, wherein the multiplexer circuit comprises a three-to-one multiplexer.

3. The flip flop circuit of claim 1, wherein the multiplexer circuit comprises:

a first two-to-one multiplexer having input terminals corresponding to the first and third input terminals, a control terminal corresponding to the first control terminal, and an output terminal; and a second two-to-one multiplexer having an input terminal corresponding to the second input terminal, an input terminal coupled to the output terminal of the first multiplexer, a control terminal corresponding to the second control terminal, and an output terminal corresponding to the multiplexer circuit output terminal.

4. The flip flop circuit of claim 1, further comprising a programmable logic block coupled between the flip flop output terminal and the second signal line.

5. The flip flop circuit of claim 4, wherein the programmable logic block comprises an adder circuit.

6. The flip flop circuit of claim 5, wherein the adder circuit has an input terminal coupled to the flip flop output terminal and an input terminal coupled to a logic "1" signal.

7. The flip flop circuit of claim 1, wherein the programmable logic circuit comprises:

a first logic control circuit which generates a first set of multiplexer control signals in response to the first and second enable signals; and a second logic control circuit which generates a second set of multiplexer control signals in response to the first and second enable signals, wherein at least one of the first and second logic control circuits is configurable into an alternate configuration.

8. The flip flop circuit of claim 7, wherein the at least one configurable logic control circuit, when in the alternate configuration, generates a third set of multiplexer control signals in response to the first and second enable signals.

9. The flip flop circuit of claim 7, wherein the first logic control circuit comprises:

a first multiplexer having a control terminal coupled to the first enable line, a first input terminal, a second input terminal coupled to the second enable line and an output terminal coupled to the first output terminal of the programmable logic circuit;

a first programmable switch coupled between the first input terminal of the first multiplexer and a line for receiving a logic low input signal;

a second programmable switch coupled between the first input terminal of the first multiplexer and the second enable line; and wherein the second logic control circuit comprises, a second multiplexer having a control terminal coupled to the second enable line, a first input terminal coupled to the first enable line, a second input terminal coupled to a line for receiving a logic low input signal, and a output terminal coupled to the second output terminal of the programmable logic circuit.

10. The flip flop circuit of claim 7, wherein the first logic control circuit comprises:

a first AND gate having an input terminal coupled to the first enable line, an input terminal coupled to the second enable line, and having an output terminal;

a first programmable switch coupled between the output terminal of the first AND gate and the first output terminal of the programmable logic circuit; and a second programmable switch coupled between the second enable line and the first output terminal of the programmable logic circuit, and wherein the second logic control circuit comprises, an inverter having an input terminal coupled to the second enable line, and having an output terminal; and a second AND gate having an input terminal coupled to the first enable line, an input terminal coupled to the output terminal of the inverter, and an output terminal coupled to the second output terminal of the programmable logic circuit.

11. The flip flop circuit of claim 7, wherein the first logic control circuit comprises:

a programmable look up table having control terminals coupled to the first and second enable lines and an output terminal coupled to the first output terminal of the programmable logic circuit.

12. The flip flop circuit of claim 11, wherein the second logic control circuit comprises:

a second programmable look up table having control terminals coupled to the first and second enable lines and an output terminal coupled to the second output terminal of the programmable logic circuit.

13. A configurable flip flop circuit comprising:

a flip flop having an input terminal and an output terminal;

a first signal line for receiving a first signal;

a second signal line for receiving a second signal;

a first enable line for receiving a first enable signal;

a second enable line for receiving a second enable signal;

a programmable logic circuit coupled to the first and second enable lines, wherein the programmable logic circuit generates multiplexer control signals in response to the first and second enable signals; and a multiplexer circuit selectably coupling the first signal line, the second signal line, and the output terminal of the flip flop to the flip flop input terminal in response to the multiplexer control signals.

14. A method of operating a flip flop circuit which includes a flip flop, a multiplexer circuit, a first signal line for receiving a first signal, and a second signal line for receiving a second signal, said method comprising the steps of:

transmitting the first signal on the first signal line to a first input terminal of the multiplexer circuit;

transmitting the second signal on the second signal line to a second input terminal of the multiplexer circuit;

transmitting an output signal from the flip flop to a third input terminal of the multiplexer circuit;

transmitting a first enable signal and a second enable signal to a programmable logic circuit;

generating multiplexer control signals within the programmable logic circuit in response to the first and second enable signals;

transmitting the multiplexer control signals to control terminals of the multiplexer circuit; and selectably coupling the first, second or third input terminal to an input terminal of the flip flop in response to the multiplexer control signals.

15. The method of claim 14, further comprising the step of programming the programmable logic circuit to operate in either a first mode or a second mode.

16. The method of claim 15, wherein the programmable logic circuit causes the multiplexer circuit to perform the following steps in the first mode:

transmitting the flip flop output signal to the flip flop input terminal when the second enable signal is low and the first enable signal is low;

transmitting the first signal to the flip flop input terminal when the second enable signal low and the first enable signal is high;

transmitting the second signal to the flip flop input terminal when the second enable signal is high and the first enable signal is low; and transmitting the first signal to the flip flop input terminal when the second enable signal is high and the first enable signal is high;

and wherein the programmable logic circuit causes the multiplexer circuit to perform the following steps in the second mode:

transmitting the flip flop output signal to the flip flop input terminal when the second enable signal is low and the first enable signal is low;

transmitting the flip flop output signal to the flip flop input terminal when the second enable signal low and the first enable signal is high;

transmitting the second signal to the flip flop input terminal when the second enable signal is high and the first enable signal is low; and transmitting the first signal to the flip flop input terminal when the second enable signal is high and the first enable signal is high.

17. The method of claim 14, further comprising the step of generating the second signal in response to the flip flop output signal.

18. The method of claim 17, further comprising the step of incrementing the flip flop output signal by one to create the second signal.

19. A method of operating a flip flop circuit comprising the steps of:

providing a first enable signal and a second enable signal;

programing a logic circuit to select one of two flip flop circuit configurations;

generating a set of control signals with the logic circuit in response the first and second enable signals, wherein the set of control signals is specific to the selected flip flop circuit configuration; and controlling the operation of the flip flop circuit using the set of control signals.

\* \* \* \* \*